(12) United States Patent
Bhattacharya et al.

(10) Patent No.: US 7,495,873 B2
(45) Date of Patent: Feb. 24, 2009

(54) ELECTROSTATIC DISCHARGE PROTECTION IN A SEMICONDUCTOR DEVICE

(75) Inventors: Dipankar Bhattacharya, Macungie, PA (US); John C. Kriz, Palmerton, PA (US); Bernard L. Morris, Emmaus, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 452 days.

(21) Appl. No.: 10/977,881

(22) Filed: Oct. 29, 2004

(65) Prior Publication Data
US 2006/0092589 A1 May 4, 2006

(51) Int. Cl.
*H02H 9/00* (2006.01)
(52) U.S. Cl. ...................................... 361/56
(58) Field of Classification Search .................... 361/56
See application file for complete search history.

(56) References Cited

U.S. PATENT DOCUMENTS

| | | | | |
|---|---|---|---|---|
| 4,656,493 | A * | 4/1987 | Adler et al. ................. | 257/376 |
| 5,239,440 | A | 8/1993 | Merrill | |
| 5,559,659 | A | 9/1996 | Strauss | |
| 5,594,381 | A * | 1/1997 | Bingham ..................... | 327/534 |
| 5,610,791 | A * | 3/1997 | Voldman ..................... | 361/56 |
| 5,767,733 | A * | 6/1998 | Grugett ...................... | 327/534 |
| 5,929,667 | A * | 7/1999 | Abadeer et al. ............. | 327/112 |
| 5,969,541 | A * | 10/1999 | Waggoner .................... | 326/81 |
| 6,404,270 | B1 * | 6/2002 | Meng .......................... | 327/534 |
| 6,757,147 | B1 * | 6/2004 | Tong et al. .................. | 361/111 |
| 6,927,957 | B1 * | 8/2005 | Bakulin et al. .............. | 361/56 |
| 6,965,263 | B2 * | 11/2005 | Bringivijayaraghavan ... | 327/537 |
| 2002/0085328 | A1 * | 7/2002 | Liu et al. .................... | 361/56 |
| 2004/0125521 | A1 * | 7/2004 | Salling et al. .............. | 361/56 |
| 2004/0263238 | A1 * | 12/2004 | Thorp et al. ................. | 327/536 |
| 2005/0083623 | A1 * | 4/2005 | Yeh et al. .................... | 361/56 |

OTHER PUBLICATIONS

R. Merrill et al., "ESD Design Methodology," Electrical Overstress/Electrostatic Discharge Symposium Proceedings, pp. 5B.5.1-5B.5.5, Sep. 1993.

\* cited by examiner

*Primary Examiner*—Stephen W Jackson
*Assistant Examiner*—Ann T Hoang
(74) *Attorney, Agent, or Firm*—Ryan, Mason & Lewis, LLP (57) ABSTRACT

An ESD protection circuit for protecting a circuit from an ESD event occurring between a first voltage supply node and a second voltage supply node associated with the circuit to be protected includes an MOS device having a gate terminal, a first source/drain terminal and a second source/drain terminal. The first source/drain terminal is connected to the first voltage supply node and the second source/drain terminal is connected to the second voltage supply node. The ESD protection circuit further includes a trigger circuit coupled to the gate terminal of the MOS device. The trigger circuit is configured to generate a control signal at the gate terminal of the MOS device for activating the MOS device during the ESD event. At least a portion of the trigger circuit is formed in a floating well which becomes biased to a voltage that is substantially equal to a first voltage when the first voltage is supplied to the first voltage supply node or to a second voltage when the second voltage is applied to the second voltage supply node, whichever voltage is greater.

20 Claims, 4 Drawing Sheets

ELECTROSTATIC DISCHARGE PROTECTION IN A SEMICONDUCTOR DEVICE

FIELD OF THE INVENTION

The present invention relates generally to electrostatic discharge (ESD) protection, and more particularly relates to ESD protection in a metal-oxide-semiconductor (MOS) device.

BACKGROUND OF THE INVENTION

The use of ESD protection circuitry for protecting an integrated circuit (IC) device from damage caused by the discharge of static electricity and/or other transient pulses (e.g., load dump) through the device is well known. An ESD event, which may include any large voltage and/or current transient pulse, may not necessarily cause immediate (i.e., catastrophic) failure of the device, but may damage only a portion of the device and/or cause a latent defect that can significantly shorten the operating life or negatively impact the reliability of the device.

Figure 1A:
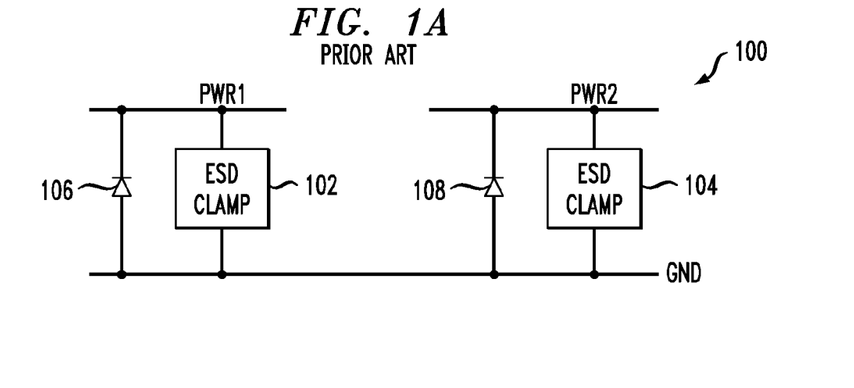
FIGS. 1A and 1B are schematic diagrams illustrating conventional ESD protection circuits for protecting a circuit from an ESD event.
Figure 1B:
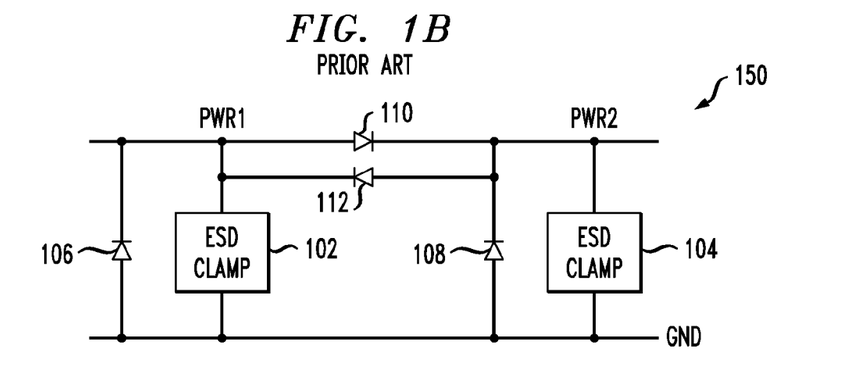

Various methodologies have been proposed for protecting a circuit from ESD, particularly between two or more isolated power pins in the IC device. FIGS. 1A and 1B illustrate examples of two conventional protection schemes for providing ESD protection between two isolated power pins PWR1 and PWR2. Each of these approaches is designed to provide an ESD discharge path between a given one of the power pins and a ground pin GND. With reference to FIG. 1A, ESD protection circuit 100 relies on ESD clamps 102 and 104, and diodes 106 and 108, connected between power pins PWR1 and PWR2, respectively, and ground. The ESD clamps 102, 104 generally include a large metal-oxide-semiconductor (MOS) transistor device (not shown). One problem with this approach, however, is that the voltage drop across the path between power pin PWR1 or PWR2 and ground may be too high, such that a breakdown of the MOS transistor device in a corresponding ESD clamp 102, 104 occurs, rendering the ESD protection circuit 100 essentially inoperable.

The ESD protection circuit 150 shown in FIG. 1B is similar to the circuit 100 shown in FIG. 1A in that circuit 150 includes ESD clamps 102 and 104, and diodes 106 and 108, connected between power pins PWR1 and PWR2, respectively, and ground pin GND. Additionally, circuit 150 includes two diodes 110 and 112 connected between the power pins PWR1 and PWR2 in a back-to-back configuration. Specifically, an anode of a first diode 110 is connected to PWR1 and a cathode of diode 110 is connected to PWR2, while an anode of diode 112 is connected to PWR2 and a cathode of diode 112 is connected to PWR1. This ESD protection approach, however, requires that the respective supply voltages applied to power pins PWR1 and PWR2 must substantially track one another, and therefore must be of the same magnitudes relative to one another. If the two voltages differ from one another by more than about 0.7 volt, the lower potential supply will be powered by the higher potential supply through a forward-biased diode (e.g., diode 110 or diode 112). Furthermore, although relying on a parasitic bipolar NPN snapback type transistor associated with the MOS device for clamping may have some limited merit, the snapback voltage is typically too high and/or uncontrollable; and thus undesirable.

Accordingly, there exists a need for an improved ESD protection circuit for protecting an IC device from ESD, particularly between two or more isolated power pins associated with the IC device, that does not suffer from one or more of the problems exhibited by conventional ESD protection circuitry.

SUMMARY OF THE INVENTION

The present invention provides techniques for protecting a circuit from damage resulting from an ESD event occurring between two or more voltage supply pins associated with the circuit to be protected.

In accordance with one aspect of the invention, an ESD protection circuit for protecting a circuit from an ESD event occurring between a first voltage supply node and a second voltage supply node associated with the circuit to be protected includes an MOS device having a gate terminal, a first source/drain terminal and a second source/drain terminal. The first source/drain terminal is connected to the first voltage supply node and the second source/drain terminal is connected to the second voltage supply node. The ESD protection circuit further includes a trigger circuit coupled to the gate terminal of the MOS device. The trigger circuit is configured to generate a control signal at the gate terminal of the MOS device for activating the MOS device during the ESD event. At least a portion of the trigger circuit is formed in a floating well which becomes biased to a voltage that is substantially equal to a first voltage when the first voltage is supplied to the first voltage supply node or to a second voltage when the second voltage is applied to the second voltage supply node, whichever voltage is greater.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative ESD protection circuit suitable for protecting a circuit, such as an IC, from damage resulting from an ESD event, particularly between a given pair of power pins associated with the circuit to be protected. It should be appreciated, however, that the present invention is not limited to this or any particular ESD protection circuit arrangement. Rather, the invention is more generally applicable to ESD protection circuitry capable of being applied between any pair of power pins, regardless of the respective voltage levels supplied to the two power pins. The term "power pins" as used herein is intended to refer to power nodes of the ESD protection circuit that are preferably accessible externally to the circuit through, for example, IC pads, bond wires, IC package pins, etc. It is to be understood that the power nodes in the ESD protection circuit may or may not be directly bonded out to corresponding package pins associated with an IC device comprising the ESD protection circuit.

During normal operation (e.g., when an ESD event is not present), the ESD protection circuit does not consume any significant direct current (DC) current and is therefore suitable for use in power sensitive applications. Moreover, although implementations of the present invention are described herein with specific reference to P-type MOS (PMOS) and N-type MOS (NMOS) transistor devices, as may be formed using a complementary metal-oxide semiconductor (CMOS) fabrication process, it is to be appreciated that the present invention is not limited to such devices and/or processes, and that other suitable transistor devices (e.g., bipolar junction transistors (BJTs), etc.) and/or fabrication processes (e.g., bipolar, BiCMOS, etc.) may be similarly employed, as will be understood by those skilled in the art.

In principle, an ESD protection circuit is active only during an ESD event and forms a current discharge path for shunting the significantly large ESD current (e.g., on the order of several amperes), as well as clamping the voltage of one or more input/output pads associated with the circuit being protected to a sufficiently low level to prevent the circuit being protected from experiencing irreversible damage. It is to be understood that a circuit being protected from the ESD event may comprise a single device, as in the case of a discrete device (e.g., a discrete power MOS transistor), or a plurality of devices which may be coupled together to form a larger circuit. An ESD event may be defined to include large voltage (e.g., on the order of several thousand volts) and/or large current (e.g., on the order of several amperes) transient pulses typically having rise times and/or fall times of less than a few nanoseconds (ns), and not merely events that are electrostatic in nature.

Conventional ESD protection circuits employing simple voltage clamps, as shown, for example, in FIGS. 1A and 1B, for protecting a circuit from an ESD event occurring between two power pins associated with the circuit are generally not capable of handling the typically large voltages which may be present between a given one of the power pins and ground. In addition, some conventional ESD protection circuits demonstrate other undesirable characteristics, such as, for example, being prone to false triggering during large signal operation of the device or circuit being protected, high leakage current, high and/or uncontrollable snapback voltage, large semiconductor area consumption, etc. The present invention provides an ESD protection circuit which advantageously overcomes one or more of the problems associated with conventional ESD protection schemes.

Figure 2:
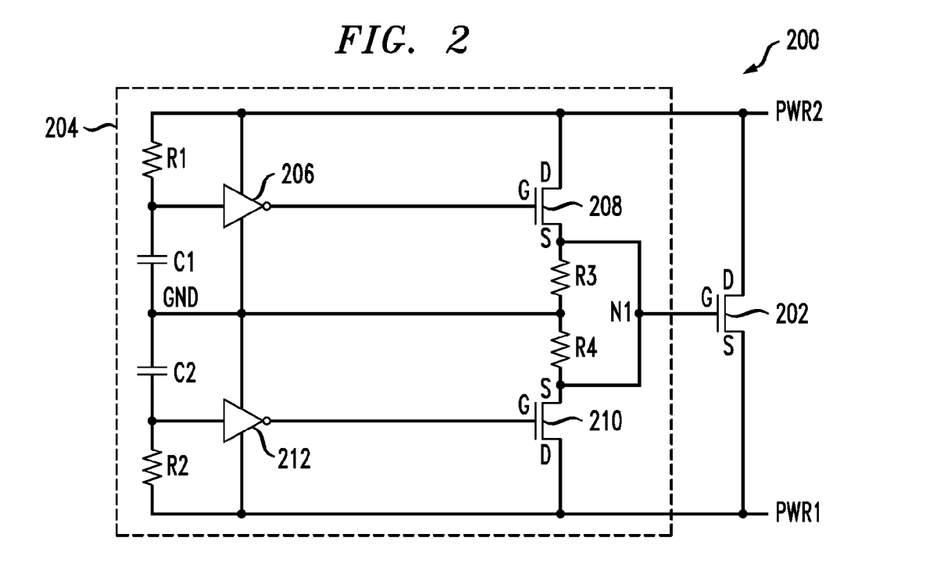
FIG. 2 is a schematic diagram illustrating an exemplary ESD protection circuit which can be modified to incorporate the techniques of the present invention.

FIG. 2 illustrates an exemplary ESD protection circuit 200 in which the techniques of the present invention can be implemented. The circuit 200 includes a relatively large NMOS transistor device 202 (e.g., on the order of a few thousand micrometers (µm)) which functions as a voltage clamp. The NMOS device 202 includes a source terminal (S) connected to a first voltage supply pin PWR1, a drain terminal (D) connected to a second voltage supply pin PWR2, and a gate terminal (G) connected to a trigger circuit 204 at node N1. The voltage supply pins PWR1 and PWR2 are electrically isolated from one another. The trigger circuit 204 preferably generates a control voltage at node N1 for activating the NMOS device 202 during an ESD event occurring between pins PWR1 and PWR2. Furthermore, the control voltage generated by the trigger circuit 204 must insure that NMOS device 202 remains inactive during normal operation of the circuit to be protected, otherwise an electrical path would undesirably be formed between the two isolated voltage supply pins PWR1 and PWR2 via NMOS device 202.

The trigger circuit 204 preferably includes a pair of inverters 206 and 212, each inverter 206, 212 driving a corresponding output stage comprised of an NMOS device 208 and 210, respectively. Specifically, NMOS device 208 has a drain terminal connected to voltage supply pin PWR2, a source terminal connected to node N1, and a gate terminal connected to an output of inverter 206. NMOS device 210 has a drain terminal connected to voltage supply pin PWR1, a source terminal connected to node N1, and a gate terminal connected to an output of inverter 212. For each of NMOS devices 208, 210, an electrical path to ground (GND) is provided via a resistor R3 and R4, respectively. Resistors R3 and R4 serve as passive loads for the corresponding NMOS transistors 208 and 210.

Once an ESD event has occurred, the amount of time that the ESD protection circuit 200 remains active is controlled primarily by a resistor-capacitor (RC) circuit coupled to an input of each of inverters 206 and 212. With regard to voltage supply pin PWR1, a resistor R2 and a capacitor C2 are connected in series between PWR1 and GND, with a junction of R2 and C2 being connected to the input of inverter 212. Likewise, with regard to voltage supply pin PWR2, a resistor R1 and a capacitor C1 are connected in series between PWR2 and GND, with a junction of R1 and C1 being connected to the input of inverter 206.

While the ESD protection circuit 200 depicted in FIG. 2 may overcome some of the problems exhibited by conventional ESD protection circuitry, one disadvantage of circuit 200 is that because the output stages in the trigger circuit 204 utilize only NMOS logic (e.g., including NMOS transistors 208, 210), the maximum control voltage generated by the trigger circuit during an ESD event for driving the large NMOS device 202 will be either $V_{PWR1}$-Vt or $V_{PWR2}$-Vt, depending on whether PWR1 or PWR2 is stressed relative to the other, where $V_{PWR1}$ and $V_{PWR2}$ are the voltages at PWR1 and PWR2, respectively, and Vt is the threshold voltage of NMOS devices 208 or 210. Consequently, the size of the NMOS device 202 must be increased substantially in order to sufficiently clamp the power pins PWR1 and PWR2 to a desired voltage, thus consuming significant additional area in the IC. One way to overcome this problem is to drive the large NMOS transistor 202 with a full CMOS output stage, rather than just using an NMOS device connected to a corresponding load resistor as in the case of circuit 200.

Figure 3:
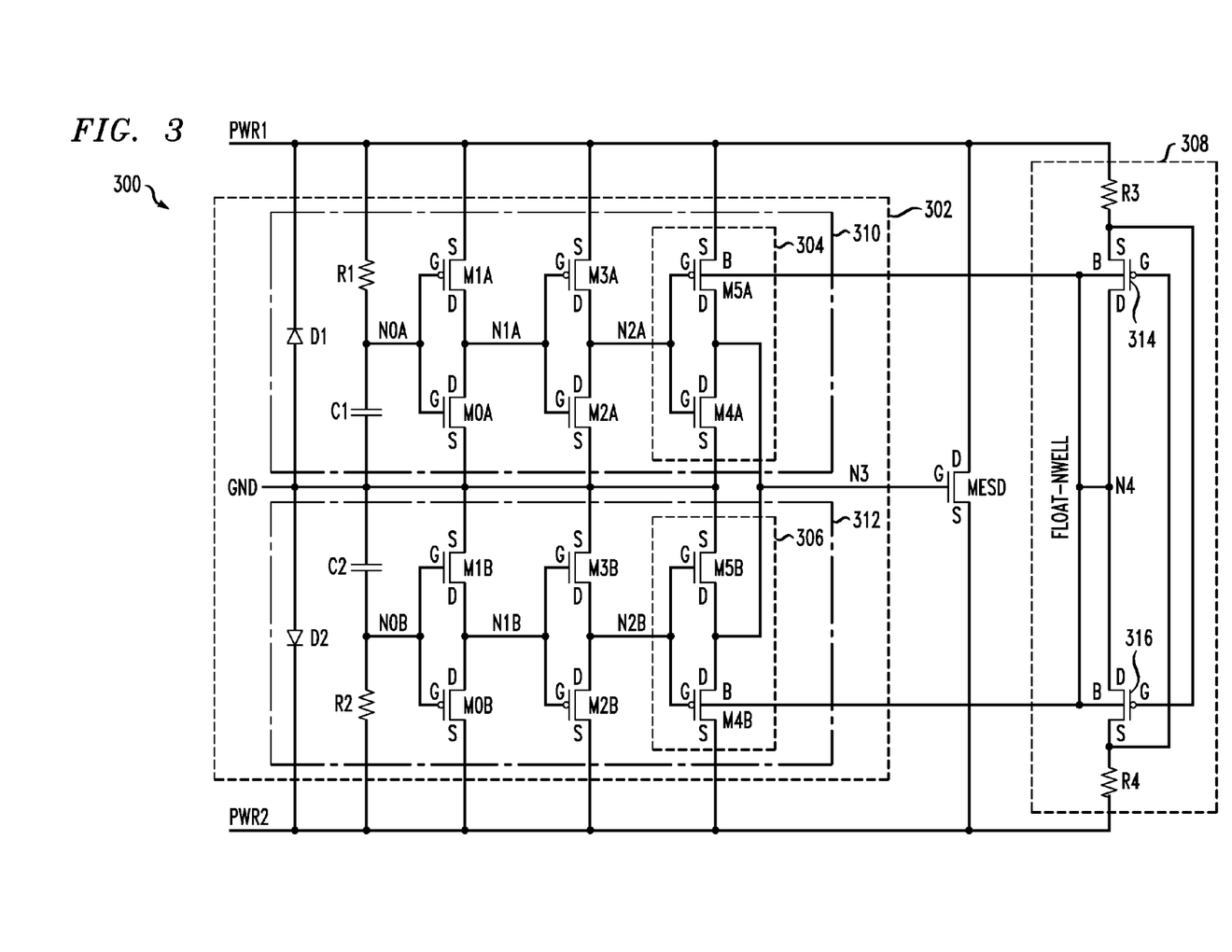
FIG. 3 is a schematic diagram illustrating an exemplary ESD protection circuit, formed in accordance with the present invention.

FIG. 3 illustrates an exemplary ESD protection circuit 300, formed in accordance with one embodiment of the present invention. The exemplary ESD protection circuit 300 comprises a large NMOS transistor Mesd sufficiently sized to handle a desired ESD current. For example, Mesd may be sized to have a width of about a few thousand µm and a length of about 160 nanometers (nm), for a standard 130 nm IC fabrication process, although the invention is not limited to a particular device size and/or type. Although a PMOS transistor may be similarly employed, the gain of a PMOS device compared to an NMOS device is generally lower, and therefore an NMOS device is preferred. Transistor Mesd, which essentially functions as a voltage clamp, preferably includes a drain terminal connected to a first voltage supply pin PWR1, a source terminal connected to a second voltage supply pin PWR2, and a gate terminal coupled to a trigger circuit 302 at node N3. It is to be appreciated that, because an MOS device is symmetrical in nature, and thus bidirectional, the assignment of source and drain designations in the MOS device is essentially arbitrary. Therefore, the source and drain terminals may be referred to herein as first and second source/drain terminals, respectively, where "source/drain" in this context denotes a source terminal or a drain terminal.

The trigger circuit 302, in a manner similar to trigger circuit 204 depicted in FIG. 2, is preferably operative to generate a control voltage for activating transistor Mesd during an ESD event, thereby clamping the voltage at PWR1 or PWR2 to a desired level. Moreover, the trigger circuit 302 is preferably operative to insure that Mesd is turned off during normal operation (e.g., when no ESD event is present). An important aspect of the exemplary trigger circuit 302 is that transistor Mesd is driven by a full CMOS output stage including both a PMOS and an NMOS device, rather than just an NMOS transistor coupled to a passive load, as in the case of the ESD protection circuit 200 of FIG. 2. Consequently, trigger circuit 302 provides a greater output drive voltage at node N3 during the ESD event, thereby beneficially allowing the size of transistor Mesd to be reduced, as compared to transistor 202 in FIG. 2, for a given current handling requirement. However, in order to prevent a parasitic diode associated with the PMOS device in the output stage of the trigger circuit 302 from inadvertently turning on and clamping the gate voltage of transistor Mesd during the ESD event, the PMOS device is formed in a floating well, as will be described in further detail below. The floating well is preferably biased to a voltage that is substantially equal to a higher one of the voltages at either PWR1 or PWR2.

As apparent from the figure, the trigger circuit 302 is preferably configured to be symmetrical with respect to ground (GND), or an alternative reference source, thereby allowing discharge in both polarities (e.g., positive and negative) of ESD stressing of the voltage supply pins PWR1 and PWR2. Trigger circuit 302 will therefore be described as comprising at least a first portion 310 coupled between voltage supply pin PWR1 and ground, and a second portion 312 coupled between voltage supply pin PWR2 and ground, the second portion being essentially identical to the first portion.

The first portion 310 of trigger circuit 302 preferably comprises a plurality of inverters, each of the inverters including a PMOS transistor and an NMOS transistor. In particular, a first inverter comprises PMOS transistor M1A and NMOS transistor M0A, each transistor having source, drain and gate terminals. The source terminal of M1A is connected to PWR1, the drain terminals of M1A and M0A are connected together to form an output of the first inverter at node N1A, the gate terminals of M1A and M0A are connected together to form an input of the first inverter at node N0A, and the source terminal of M0A is connected to ground. Likewise, a second inverter comprises PMOS transistor M3A and NMOS transistor M2A. A source terminal of M3A is connected to PWR1, drain terminals of M2A and M3A are connected together to form an output of the second inverter at node N2A, gate terminals of M2A and M3A are connected to the output of the first inverter at node N1A, and a source terminal of M2A is connected to ground.

The input of the first inverter is preferably coupled to an RC circuit, or alternative timing circuitry, for controlling an amount of time that the trigger circuit 302 remains active after the ESD event occurs, as will be understood by those skilled in the art. The RC circuit includes a resistor R1 connected in series with a capacitor C1 between voltage supply pin PWR1 and ground, the junction of R1 and C1 being connected to the input of the first inverter at node N0A. In a preferred embodiment of the invention, the time constant τ, where τ=R×C, of the RC circuit is selected to be in a range from about one microsecond (μs) to about 100 μs, although the invention is not limited to any particular time constant. A time constant of about 2 μs is preferred in that it would allow the ESD circuit to remain active substantially beyond the duration of a Human Body Model ESD event, that has an RC duration of about 150 ns (e.g., 1.5 kilo (K) ohms and 100 picofarad (pF)), and yet is substantially less than the duration of a typical voltage supply ramp-up period (e.g., power-up), generally several milliseconds (ms). Resistance and capacitance values of R1 and C1, respectively, may be chosen so as to provide the desired time constant (e.g., 2 μs), such as, for example, a resistance value of about 400 k ohms and a capacitance value of about 5 pF.

The first portion 310 of trigger circuit 302 further includes an output stage 304 having an input coupled to the output of the second inverter at node N2A and having an output at node N3 for generating a control voltage for controlling transistor Mesd. Specifically, the output stage 304 is preferably configured as a full CMOS inverter, comprising NMOS transistor M4A and PMOS transistor M5A, each transistor including a drain terminal, a source terminal and a gate terminal. The source terminal of M5A is connected to PWR1, the drain terminals of M4A and M5A are connected together at node N3, the gate terminals of M4A and M5A are connected to the output of the second inverter at node N2A, and the source terminal of M4A is connected to ground. As previously explained, PMOS transistor M5A is formed in a floating N-well in order to prevent a parasitic diode associated with M5A from becoming forward-biased and clamping the gate voltage of Mesd during the ESD event. Transistor M5A is therefore depicted as a four terminal device, including a bulk (body) terminal (B) connected to a bias generator 308 for biasing the floating well to a voltage potential which is substantially equal to a higher one of the voltages at either of the voltage supply pins PWR1 or PWR2.

Likewise, the second portion 312 of the trigger circuit 302 preferably comprises a plurality of inverters. A first inverter includes PMOS transistor M0B and NMOS transistor M1B, each transistor having source, drain and gate terminals. The source terminal of M0B is connected to PWR2, the drain terminals of M0B and M1B are connected together to form an output of the first inverter at node N1B, the gate terminals of M0B and M1B are connected together to form an input of the first inverter at node N0B, and the source terminal of M1B is connected to ground. A second inverter comprises PMOS transistor M2B and NMOS transistor M3B. A source terminal of M2B is connected to PWR2, drain terminals of M2B and M3B are connected together to form an output of the second inverter at node N2B, gate terminals of M2B and M3B are connected to the output of the first inverter at node N1B, and a source terminal of M3B is connected to ground.

The second portion 312 of trigger circuit 302 further includes an output stage 306 having an input coupled to the output of the second inverter at node N2B and having an output at node N3 for generating the control voltage presented to transistor Mesd. Specifically, the output stage 306, like output stage 304, is preferably configured as a full CMOS inverter, comprising NMOS transistor M5B and PMOS transistor M4B, each transistor including a drain terminal, a source terminal and a gate terminal. The source terminal of M4B is connected to PWR2, the drain terminals of M4B and M5B are connected together at node N3, the gate terminals of M4B and M5B are connected to the output of the second inverter at node N2B, and the source terminal of M5B is connected to ground. In a manner similar to the output stage 304 described above, PMOS transistor M4B is formed in a floating N-well in order to prevent a parasitic diode associated with M4B from becoming forward-biased and undesirably clamping the gate voltage of Mesd during the ESD event. Transistor M4B is therefore depicted as a four terminal device, including a bulk terminal connected to the bias generator 308 for biasing the floating well to a voltage potential which is substantially equal to a higher one of the voltages at either of the voltage supply pins PWR1 or PWR2.

It is to be appreciated that while the first and second portions 310, 312 of trigger circuit 302 are shown as including three inverters, the trigger circuit is not limited to the particular number of inverters shown. Rather, the number of inverters employed may be selected so as to optimize a delay through the trigger circuit 302. An objective of this approach is to drive the large transistor Mesd, which has a significant gate capacitance associated therewith, with a minimum sized inverter. As will be understood by those skilled in the art, the strategy is to increase the size of each successive inverter in the trigger circuit by a factor of about 2.7 times the inverter preceding. The propagation delay through each inverter will ideally be a constant, approximately equal to about $2.7\tau$, where $\tau$ is a delay of a minimum sized inverter with an equivalent load of another minimum sized inverter.

Each of the first and second portions 310, 312 of trigger circuit 302 preferably includes a diode D1 and D2, respectively, connected between a corresponding voltage supply pin PWR1, PWR2 and ground. Specifically, anodes of diodes D1 and D2 are connected to ground, a cathode of D1 is connected to PWR1 and a cathode of D2 is connected to PWR2. The diodes provide ESD protection when a given one of the voltage supply pins PWR1, PWR2 is stressed with respect to ground by clamping the voltage at the corresponding supply pin. The voltage at which the voltage supply pins are clamped may be based, at least in part, on a reverse breakdown voltage of the diodes, as will be understood by those skilled in the art. Diodes D1 and D2 preferably comprise discrete junction (e.g., N+ to P-well) diodes.

The bias generator 308 for biasing the floating well in which PMOS transistors M5A and M4B are formed preferably comprises a pair of PMOS transistors 314 and 316. Transistors 314 and 316 are preferably formed in the same floating N-well as PMOS transistors M5A and M4B. A source terminal of transistor 314 is connected to voltage supply pin PWR1 via a series resistor R3. Likewise, a source terminal of transistor 316 is connected to voltage supply pin PWR2 via a series resistor R4. Resistors R3 and R4 are preferably of low resistance (e.g., about 100 ohms) and function, at least in part, as current limiting resistors for limiting the discharge current through corresponding transistors 314 and 316. A gate terminal of transistor 314 is connected to the source terminal of transistor 316, and a gate terminal of transistor 316 is connected to the source terminal of transistor 314 in a cross-coupled arrangement. Drain terminals of transistors 314 and 316 are connected together at node N4 to form an output of the bias generator 308. Bulk terminals of transistors 314 and 316 are connected to node N4, as are the bulk terminals of transistors M5A and M4B. Each of transistors 314 and 316 is preferably small in size, such as, for example, having a width of about 10 µm and a length of about 160 nm (for a standard 130 nm process), although the invention is not limited to any particular size for transistors 314 and 316. It is to be appreciated that the bias generator 308 need not be included in the ESD protection circuit 300, but may instead be supplied externally.

Figure 4:
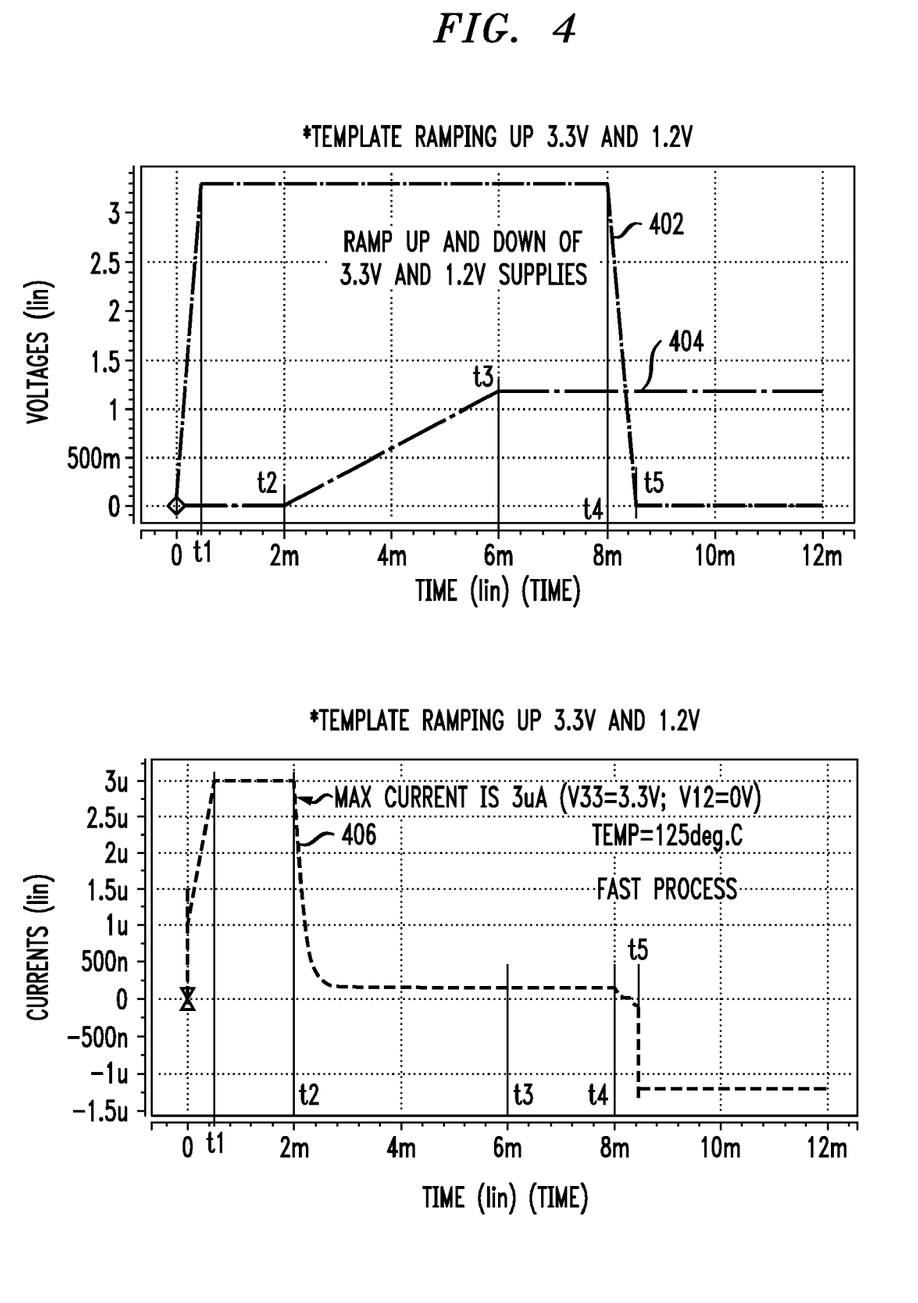
FIG. 4 is a graphical illustration depicting exemplary electrical characteristics of the ESD protection circuit shown in FIG. 3 during normal operation, in accordance with the present invention.
Figure 5:
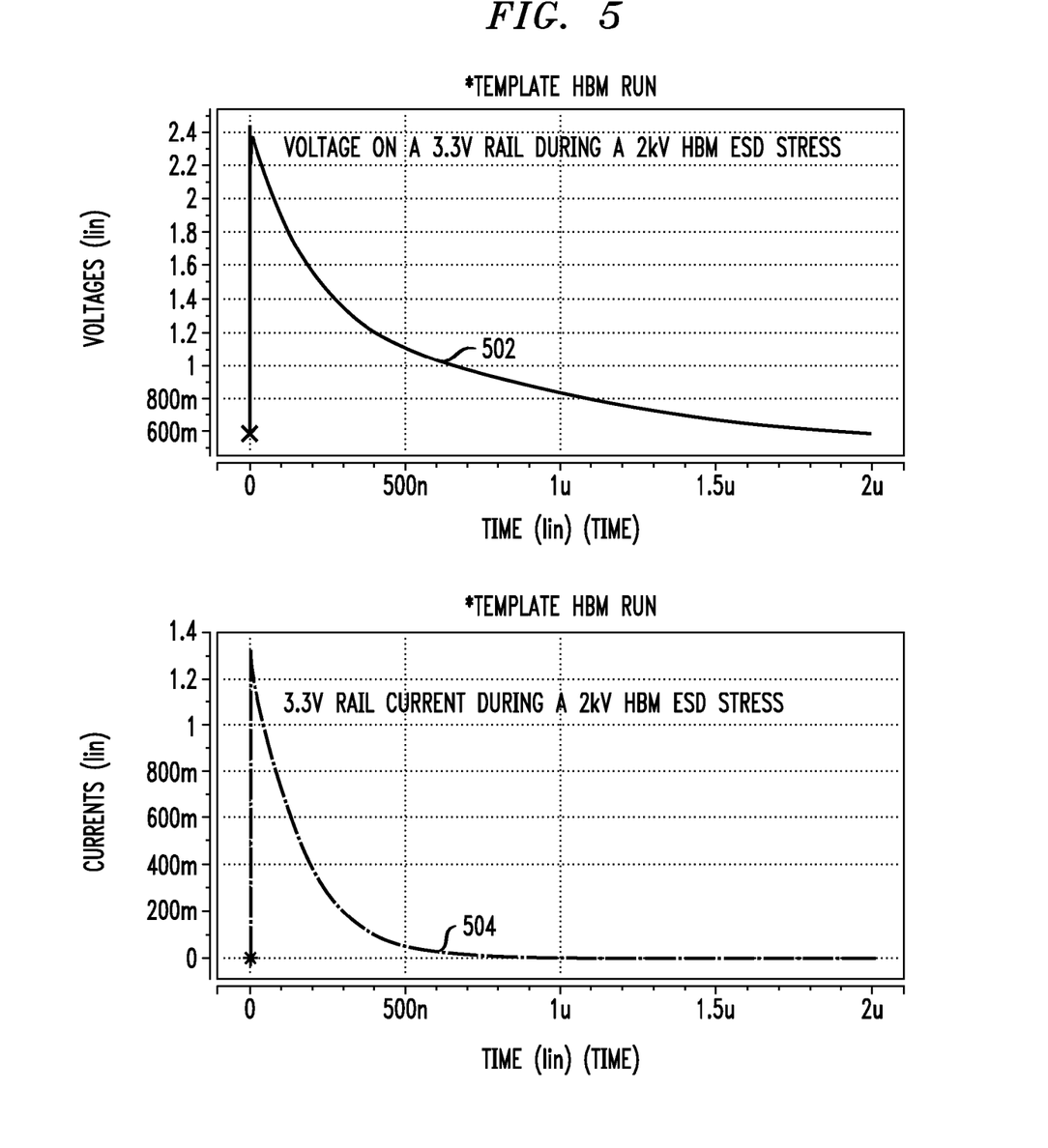
FIG. 5 is a graphical illustration depicting exemplary electrical characteristics of the ESD protection circuit shown in FIG. 3 during an ESD event, in accordance with the present invention.

With reference to FIGS. 4 and 5, an operation of the ESD protection circuit 300 will now be described in further detail. Without loss of generality, during normal operation, such as, for example, when there is no ESD event, resistors R1 and R2 pull nodes N0A and N0B, respectively, to corresponding voltage supplies PWR1 and PWR2, thereby turning on NMOS transistors M0A and M1B and turning off PMOS transistors M1A and M0B. Transistors M0A and M1B being turned on forces respective nodes N1A and N1B to a logic low state (e.g., ground). Nodes N1A and N1B being a logic low turns on PMOS transistors M3A and M2B and turns off NMOS transistors M2A and M3B. Transistors M3A and M2B being turned on forces respective nodes N2A and N2B to a logic high state (e.g., PWR1 and PWR2, respectively). Nodes N2A and N2B being a logic high turns on NMOS transistors M4A and M5B and turns off PMOS transistors M5A and M4B. Transistors M4A and M5B being turned on forces node N3 to a logic low state, thereby turning off the large NMOS transistor Mesd. It is to be understood that because there are essentially two separate portions 310, 312 of the trigger circuit 302 which can generate the control voltage presented to the gate terminal of transistor Mesd, either of the voltages supplied to PWR1 and PWR2 may be off and Mesd will remain off. Moreover, the respective voltages at voltage supply pins PWR1 and PWR2 need not be the same. In fact, during normal operation of the circuit, one of the voltage supply pins (e.g., PWR1) is preferably coupled to an input/output (IO) supply, which may be about 3.3 volts, while the other voltage supply pin (e.g., PWR2) is preferably coupled to a core circuitry supply of about 1.2 volts.

FIG. 4 is a graphical illustration depicting an exemplary simulation of the ESD protection circuit 300 shown in FIG. 3 as the voltage potentials applied to corresponding voltage supply pins PWR1 and PWR2 are ramped up from zero. Although the simulation assumes different supply ramp rates for the two voltage supplies PWR1 and PWR2, the techniques of the present invention are similarly applicable for essentially any combination of ramp rates. Graph 402 represents the voltage at PWR1, which is assumed to be the 3.3 volt IO supply, graph 404 represents the voltage at PWR2, which is assumed to be the 1.2 volt core supply, and graph 406 represents the current dissipation in the ESD protection circuit.

As shown in the exemplary simulation, when both supplies are off (e.g., at time 0), the current in the ESD circuit 300 is essentially zero and remains zero until the voltage at PWR1 rises above a threshold voltage level (e.g., about 0.35 volt) of the transistors in the first portion 310 of trigger circuit 302. After PWR1 reaches the threshold voltage level, the circuit 300 powers up and begins to draw current. Maximum positive current, in this case about 3.3 microamperes (µA), consumed by the circuit 300 under normal operation will be at about time t1 (e.g., about 0.5 ms), at which point PWR1 is fully ramped up to 3.3 volts and PWR2 is at zero volts.

At time t2 (e.g., about 2 ms), the voltage at PWR2 begins to ramp up. As the voltage at PWR2 ramps up, the current in the circuit 300 will fall to its quiescent operating value of about 0.2 µA once PWR2 rises above about a threshold voltage level (e.g., 0.35 volt) of the transistors in the second portion 312 of the trigger circuit 302. PWR2 is fully ramped up to its core voltage level of about 1.2 volts at about time t3 (e.g., about 6 ms), where it remains for the duration of the simulation. At about time t4 (e.g., about 8 ms), the voltage at PWR1 begins to fall again. Once the voltage at PWR1 falls below the threshold voltage level of the transistors in the first portion 310 of the trigger circuit 302, the current in the circuit drops to a maximum negative current, in this case about −1.25 µA when PWR1 is at zero volts and PWR2 is at 1.2 volts.

During an ESD event, one of the voltage supply pins PWR1, PWR2 may be stressed relative to the other. Similarly, one or both of the voltage supply pins PWR1, PWR2 may be stressed with respect to ground GND. By way of example only, assume that voltage supply pins PWR1 and PWR2 are at ground potential (e.g., zero volts). When PWR1 is stressed with respect to PWR2, the first portion 310 of trigger circuit 302 will provide the control voltage at node N3 for activating transistor Mesd. Specifically, when the voltage potential on voltage supply pin PWR1 is stressed above ground (e.g., 2 kilovolt (kV) Human Body Model (HBM)), capacitor C1 will at least initially hold node N0A at ground. Once PWR1 rises about a threshold voltage above ground, transistor M1A will turn on. Transistor M1A being turned on forces node N1A to a high logic state, thereby turning on transistor M2A and turning off transistor M3A. Transistor M2A being turned on forces node N2A low, thereby turning on transistor M5A and turning off transistor M4A. Transistor M5A being turned on pulls node N3, and thus the gate terminal of transistor Mesd, high, thereby turning on Mesd and clamping the voltage on PWR1 to a desired value. As previously stated, because PMOS transistor M5A is formed in a floating well biased to the higher potential, this case PWR1, the parasitic diode between the N-well and P-substrate does not become forward-biased, and therefore does not clamp the voltage on the gate terminal of Mesd.

Similarly, assuming voltage supply pin PWR2 is at ground potential, when PWR2 is stressed with respect to PWR1, the second portion 312 of trigger circuit 302 will provide the control voltage at node N3 for activating transistor Mesd. Specifically, when the voltage potential on voltage supply pin PWR2 is stressed above ground (e.g., 2 kV HBM), capacitor C2 will at least initially hold node N0B at ground potential. Once PWR2 rises about a threshold voltage above ground, transistor M0B will turn on. Transistor M0B being turned on forces node N1B to a high logic state, thereby turning on transistor M3B and turning off transistor M2B. Transistor M3B being turned on forces node N2B low, thereby turning on transistor M4B and turning off transistor M5B. Transistor M4B being turned on pulls node N3, and thus the gate terminal of transistor Mesd, high, thereby turning on Mesd and clamping the voltage on PWR1. Again, since PMOS transistor M5A is formed in a floating well biased to the higher potential, in this case PWR2, the parasitic diode between the N-well and P-substrate does not become forward-biased, and therefore does not undesirably clamp the voltage on the gate terminal of Mesd.

When PWR1 and/or PWR2 is stressed with respect to ground GND rather than with respect to one another, diodes D1 and/or D2, respectively, will clamp the respective voltages to a desired potential. Accordingly, diodes D1 and D2 are to be sized appropriately to handle the expected ESD current, as will be understood by those skilled in the art.

FIG. 5 is a graphical illustration depicting an exemplary simulation of the ESD protection circuit 300 shown in FIG. 3 as a 2 kV HBM ESD stress is applied to voltage supply pin PWR1. Graph 502 represents the voltage at PWR1 and graph 504 represents the current flowing in PWR1. As apparent from the figure, the ESD protection circuit 300 successfully clamps the voltage at PWR1 to a maximum of about 2.4 volts, while limiting the current in the circuit to a maximum of about 1.3 amperes. Since the trigger circuit 302 in the exemplary ESD protection circuit 300 is symmetrical by design, a similar result would be obtained when the ESD stress is applied to voltage supply pin PWR2.

At least a portion of the ESD protection circuit of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An electrostatic discharge (ESD) protection circuit for protecting a circuit from an ESD event occurring between a first voltage supply node and a second voltage supply node associated with the circuit, the first and second voltage supply nodes being electrically isolated from one another, the ESD protection circuit comprising:

a metal-oxide semiconductor (MOS) device including a gate terminal, a first source/drain terminal and a second source/drain terminal, the first source/drain terminal being connected to the first voltage supply node and the second source/drain terminal being connected to the second voltage supply node; and a trigger circuit coupled to the gate terminal of the MOS device, the trigger circuit being configured to generate a control signal at the gate terminal of the MOS device for activating the MOS device during at least a portion of the ESD event, at least a portion of the trigger circuit being formed in a floating well which becomes biased to a voltage that is substantially equal to a higher one of a first voltage when the first voltage is supplied to the first voltage supply node and a second voltage when the second voltage is applied to the second voltage supply node.

2. The circuit of claim 1, wherein the trigger circuit comprises an output stage for generating the control signal, at least a portion of the output stage being formed in the floating well.

3. The circuit of claim 1, further comprising a bias generator including a first input connected to the first voltage supply node, a second input connected to the second voltage supply node, and an output operatively coupled to the trigger circuit, the bias generator being operative to generate the voltage for biasing the floating well.

4. The circuit of claim 3, wherein the bias generator comprises a first PMOS transistor and a second PMOS transistor, each of the first and second PMOS transistors having a source terminal, a drain terminal, a gate terminal and a bulk terminal, the source terminal of the first PMOS transistor being connected to the first voltage supply node, the source terminal of the second PMOS transistor being connected to the second voltage supply node, the gate terminal of the first PMOS transistor being connected to the source terminal of the second PMOS transistor, the gate terminal of the second PMOS transistor being connected to the source terminal of the first PMOS transistor, and the bulk and drain terminals of the first and second PMOS transistors being connected together for generating the voltage for biasing the floating well.

5. The circuit of claim 3, wherein the bias generator comprises first and second PMOS transistors connected together in a cross-coupled arrangement, the first and second PMOS transistors being formed in the floating well.

6. The circuit of claim 5, wherein the first and second PMOS transistors in the bias generator are formed in close relative proximity to corresponding PMOS transistors in the trigger circuit, the corresponding PMOS transistors in the trigger circuit being formed in the floating well.

7. The circuit of claim 1, wherein the trigger circuit comprises:
at least a first inverter having an input coupled to a first timing circuit and having an output;
a first output stage having an input coupled to the output of the at least first inverter and having an output for generating the control signal, the first output stage including a PMOS transistor formed in the floating well;
at least a second inverter having an input coupled to a second timing circuit and having an output; and
a second output stage having an input coupled to the output of the at least second inverter and having an output for generating the control signal, the second output stage including a PMOS transistor formed in the floating well;
wherein the at least first inverter and first output stage are coupled between the first voltage supply node and a reference source, and wherein the at least second inverter and second output stage are coupled between the second voltage supply node and the reference source.

8. The circuit of claim 7, wherein at least a given one of the first and second timing circuits comprises a resistor and a capacitor, each of the resistor and capacitor including first and second terminals, the first terminal of the resistor being connected to a corresponding voltage supply node, the second terminal of the resistor being connected to the first terminal of the capacitor, and the second terminal of the capacitor being connected to the reference source, a value of the resistor and a value of the capacitor being selected to control an amount of time that the ESD protection circuit remains active after the ESD event occurs.

9. The circuit of claim 7, wherein at least one of the first and second timing circuits is configured to have a time constant that is in a range from about one microsecond to about 100 microseconds.

10. The circuit of claim 1, wherein the trigger circuit is configured in a symmetrical arrangement with respect to a common reference source, thereby allowing a discharge in at least one of a positive polarity and a negative polarity ESD stressing of the first and second voltage supply nodes.

11. The circuit of claim 1, wherein the trigger circuit comprises:
a first portion coupled between the first voltage supply node and a reference source, and a second portion coupled between the second voltage supply node and the reference source, at least a given one of the first and second portions comprising:
at least a first inverter having an input and an output;
an output stage having an input coupled to the output of the first inverter and having an output for generating the control signal, the output stage including a PMOS transistor formed in the floating well; and
a timing circuit coupled to the input of the first inverter for selectively controlling an amount of time that the ESD protection circuit is active after the ESD event occurs.

12. The circuit of claim 11, wherein the output stage comprises a second inverter having an input and an output, the input of the second inverter being coupled to the output of the first inverter and the output being coupled to the gate terminal of the MOS device.

13. The circuit of claim 1, further comprising:
a first diode having a cathode connected to the first voltage supply node and an anode connected to a reference source; and
a second diode having a cathode connected to the second voltage supply node and an anode connected to the reference source.

14. The circuit of claim 1, wherein the first source/drain terminal of the MOS device comprises a drain terminal and the second source/drain terminal comprises a source terminal.

15. An integrated circuit including at least one electrostatic discharge (ESD) protection circuit for protecting a circuit from an ESD event occurring between a first voltage supply node and a second voltage supply node associated with the circuit, the first and second voltage supply nodes being electrically isolated from one another, the at least one ESD protection circuit comprising:
a metal-oxide semiconductor (MOS) device including a gate terminal, a first source/drain terminal and a second source/drain terminal, the first source/drain terminal being connected to the first voltage supply node and the second source/drain terminal being connected to the second voltage supply node; and
a trigger circuit coupled to the gate terminal of the MOS device, the trigger circuit being configured to generate a control signal at the gate terminal of the MOS device for activating the MOS device during at least a portion of the ESD event, at least a portion of the trigger circuit being formed in a floating well which becomes biased to a voltage that is substantially equal to a higher one of a first voltage when the first voltage is supplied to the first voltage supply node and a second voltage when the second voltage is applied to the second voltage supply node.

16. The integrated circuit of claim 15, wherein the trigger circuit comprises an output stage for generating the control signal, at least a portion of the output stage being formed in the floating well.

17. The integrated circuit of claim 15, further comprising a bias generator including a first input connected to the first voltage supply node, a second input connected to the second voltage supply node, and an output operatively coupled to the trigger circuit, the bias generator being operative to generate the voltage for biasing the floating well.

18. The integrated circuit of claim 17, wherein the bias generator comprises a first PMOS transistor and a second PMOS transistor, each of the first and second PMOS transistors having a source terminal, a drain terminal, a gate terminal and a bulk terminal, the source terminal of the first PMOS transistor being connected to the first voltage supply node, the source terminal of the second PMOS transistor being connected to the second voltage supply node, the gate terminal of the first PMOS transistor being connected to the source terminal of the second PMOS transistor, the gate terminal of the second PMOS transistor being connected to the source terminal of the first PMOS transistor, and the bulk and drain terminals of the first and second PMOS transistors being connected together for generating the voltage for biasing the floating well.

19. The integrated circuit of claim 15, wherein the trigger circuit comprises:
a first portion coupled between the first voltage supply node and a reference source, and a second portion coupled between the second voltage supply node and the reference source, at least a given one of the first and second portions comprising:
at least a first inverter having an input and an output;
an output stage having an input coupled to the output of the first inverter and having an output for generating the control voltage, the output stage including a PMOS transistor formed in the floating well; and a timing circuit coupled to the input of the first inverter for selectively controlling an amount of time that the ESD protection circuit is active after the I3SD event occurs.

20. The integrated circuit of claim 15, wherein the trigger circuit comprises:

at least a first inverter having an input coupled to a first timing circuit and having an output;

a first output stage having an input coupled to the output of the at least first inverter and having an output for generating the control voltage, the first output stage including a PMOS transistor formed in the floating well;

at least a second inverter having an input coupled to a second timing circuit and having an output; and a second output stage having an input coupled to the output of the at least second inverter and having an output for generating the control voltage, the second output stage including a PMOS transistor formed in the floating well;

wherein the at least first inverter and first output stage are coupled between the first voltage supply node and a reference source, and wherein the at least second inverter and second output stage are coupled between the second voltage supply node and the reference source.

* * * * *